United States Patent
Fang et al.

(10) Patent No.: US 10,038,097 B2
(45) Date of Patent: Jul. 31, 2018

(54) LIGHT EMITTING DIODE DISPLAY SUBSTRATE, A METHOD FOR MANUFACTURING THE SAME, AND DISPLAY DEVICE

(71) Applicant: Boe Technology Group Co., Ltd., Beijing (CN)

(72) Inventors: Jingang Fang, Beijing (CN); Youngsuk Song, Beijing (CN); Hongda Sun, Beijing (CN); Wei Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 3 days.

(21) Appl. No.: 15/504,030

(22) PCT Filed: Aug. 16, 2016

(86) PCT No.: PCT/CN2016/095502
§ 371 (c)(1),
(2) Date: Feb. 15, 2017

(87) PCT Pub. No.: WO2017/118027
PCT Pub. Date: Jul. 13, 2017

(65) Prior Publication Data
US 2018/0108781 A1    Apr. 19, 2018

(30) Foreign Application Priority Data
Jan. 4, 2016    (CN) .......................... 2016 1 0006393

(51) Int. Cl.
*H01L 29/786*    (2006.01)
*H01L 51/00*    (2006.01)
(Continued)

(52) U.S. Cl.
CPC .... *H01L 29/78627* (2013.01); *H01L 27/1214* (2013.01); *H01L 27/3246* (2013.01);
(Continued)

(58) Field of Classification Search
CPC ........... H01L 29/78627; H01L 51/0011; H01L 27/3276; H01L 27/3246; H01L 27/3295; H01L 27/1214; H01L 51/56
See application file for complete search history.

(56) References Cited

U.S. PATENT DOCUMENTS

| 2001/0026125 | A1 | 10/2001 | Yamazaki et al. |
| 2007/0236429 | A1 | 10/2007 | Tseng et al. |

FOREIGN PATENT DOCUMENTS

| CN | 1423513 | 6/2003 |
| CN | 101013221 | 8/2007 |

(Continued)

OTHER PUBLICATIONS

International Search Report for PCT/CN2016/095502 dated Sep. 23, 2016.
(Continued)

*Primary Examiner* — Joseph L Williams
(74) *Attorney, Agent, or Firm* — Calfee, Halter & Griswold LLP

(57) ABSTRACT

A light emitting diode display substrate, a method of manufacturing the same, and a display device are provided. The method includes: forming a planarization layer and a photoresist layer in sequence on a substrate on which a thin film transistor is formed, a light sensitivity of the planarization layer being higher than a light sensitivity of the photoresist layer; etching the planarization layer and the photoresist layer simultaneously, such that a pixel defining pattern is formed through a removed portion of the photoresist layer, and an anode via pattern is formed at a position of the planarization layer corresponding to the pixel defining pattern; forming an anode pattern layer on the substrate on which the above steps were performed, wherein the anode pattern layer comprises a plurality of anodes, such that the
(Continued)

planarization layer located at edges of the anode via pattern covers edges of the anodes.

16 Claims, 5 Drawing Sheets

(51) Int. Cl.
    *H01L 27/32*     (2006.01)
    *H01L 27/12*     (2006.01)
    *H01L 51/56*     (2006.01)

(52) U.S. Cl.
    CPC ...... *H01L 27/3276* (2013.01); *H01L 27/3295* (2013.01); *H01L 51/0011* (2013.01); *H01L 51/56* (2013.01)

(56) References Cited

FOREIGN PATENT DOCUMENTS

| | | |
|---|---|---|
| CN | 101060130 | 10/2007 |
| CN | 101814522 | 8/2010 |
| CN | 103500752 | 1/2014 |
| CN | 104538357 | 4/2015 |
| CN | 104576705 | 4/2015 |
| CN | 105449127 | 3/2016 |

OTHER PUBLICATIONS

Office Action from China Application No. 201610006393.6 dated Dec. 20, 2016.

Second Office Action for Chinese Patent Application No. 201610006393.6 dated Jun. 28, 2017.

Third Office Action for Chinese Patent Application No. 201610006393.6 dated Sep. 18, 2017.

LIGHT EMITTING DIODE DISPLAY SUBSTRATE, A METHOD FOR MANUFACTURING THE SAME, AND DISPLAY DEVICE

CROSS REFERENCE TO RELATED APPLICATIONS

The present application is a US national phase of PCT Application No. PCT/CN2016/095502, filed on Aug. 6, 2016, which is based upon and claims priority to Chinese Patent Application No. 201610006393.6, filed on Jan. 4, 2016, and the entire contents thereof are incorporated herein by reference.

TECHNICAL FIELD

The present disclosure relates to the field of display technology, and more particularly, to a light emitting diode display substrate, a method of manufacturing the same, and a display device including the same.

BACKGROUND

In the field of display technology, a photodiode display panel has become a hot spot of current display research because of its high response speed, high color gamut, high contrast ratio, wide viewing angle, ultra-thin, low power consumption and so on. A light emitting diode display panel includes a bottom emission mode and a top emission mode. In the bottom emission mode of the light emitting diode display panel, a white organic light emitting diode (OLED) is made underneath a thin film transistor TFT array. The fabrication process is relatively simple. However, a metal wiring can block the light emitted by the OLED, resulting in a decrease in the aperture ratio and difficulty in manufacturing high PPI (pixels per inch) products. In the top-emission mode, a white OLED emits light above the active matrix. There is no problem of shielding the light by the metal wiring, and it has the advantage of high aperture ratio, so it is widely used.

The top emission mode has two structures, in which one structure is obtained by combining a substrate having a TFT array and an OLED with a cover plate coated with a color filter layer through a spacer, in which the combination of the array substrate and the color film cover plate requires a certain height in the alignment to avoid the impact of particulate matter on the OLED. If the height of the combination is too low, the combination cannot be performed because the alignment precision of the device cannot meet the requirements. If the height of the combination is too high, the size of the black matrix should be increased to prevent light leakage, and thus the aperture ratio is reduced. Another structure of the top emission mode is to fabricate the color filter layer directly on the OLED, and then encapsulate it with the cover plate, and this structure can effectively improve the aperture ratio.

In the conventional OLED back plate, in the preparation of a planarization layer, a reflective anode layer, and a pixel definition layer, three masking processes needs to be implemented, and the processes is more. If the pixel definition layer is not used, because metal boundaries of the reflective anode are relatively rough, and various layers in the OLED device are very thin, a short circuit may occur at the metal boundaries of the anode during an evaporation process, resulting in dark spots, which may affect the yield of the product.

It should be noted that, information disclosed in the above background portion is provided only for better understanding of the background of the present disclosure, and thus it may contain information that does not form the prior art known by those ordinary skilled in the art.

SUMMARY

An object of the present disclosure is to provide a light emitting diode display substrate, a method of manufacturing the same, and a display device.

According to a first aspect of the present disclosure, there is provided a method for manufacturing a light emitting diode display substrate, including:

forming a planarization layer and a photoresist layer in sequence on a substrate on which a thin film transistor is formed, wherein a light sensitivity of the planarization layer is higher than a light sensitivity of the photoresist layer;

etching the planarization layer and the photoresist layer simultaneously, such that a pixel defining pattern is formed through a removed portion of the photoresist layer, and an anode via pattern is formed at a position of the planarization layer corresponding to the pixel defining pattern, wherein the anode via pattern is located above a source electrode of the thin film transistor to expose at least a portion of the source electrode of the thin film transistor;

forming an anode pattern layer on the substrate on which the above steps were performed, wherein the anode pattern layer includes a plurality of anodes formed on the anode via pattern and connected with the source electrode; and post-baking the planarization layer which is developed, such that the planarization layer located at an edge of the anode via pattern covers an edge of the anode.

According to a second aspect of the present disclosure, there is also provided a light emitting diode display substrate, including a thin film transistor, a planarization layer and an anode pattern layer sequentially formed on a base substrate, the anode pattern layer includes a plurality of anodes, wherein an anode via pattern is formed in the planarization layer, the anode via pattern is located above a source electrode of the thin film transistor to expose at least a portion of the source electrode of the thin film transistor, the anodes are formed on the anode via pattern and connected with the source electrode, and the planarization layer located at edges of the anode via pattern covers edges of the anodes.

According to a third aspect of the present disclosure, there is also provided a display device, including the above light emitting diode display substrate provided by the present disclosure.

It is to be understood that both the foregoing general description and the following detailed description are exemplary and explanatory only and are not restrictive of the invention, as claimed.

This section provides a summary of various implementations or examples of the technology described in the disclosure, and is not a comprehensive disclosure of the full scope or all features of the disclosed technology.

BRIEF DESCRIPTION OF THE DRAWINGS

The accompanying drawings, which are included to provide a further understanding of the present disclosure and are incorporated in and constitute a part of the specification, together with the following detailed description serve to explain the present disclosure and are not to be construed as limiting the present disclosure.

DETAILED DESCRIPTION

Hereinafter, embodiments of the present disclosure will be described in detail with reference to the accompanying drawings. It is to be understood that the specific embodiments described herein are for the purpose of illustration and explanation only and are not intended to be limiting of the present disclosure.

Figure 1:
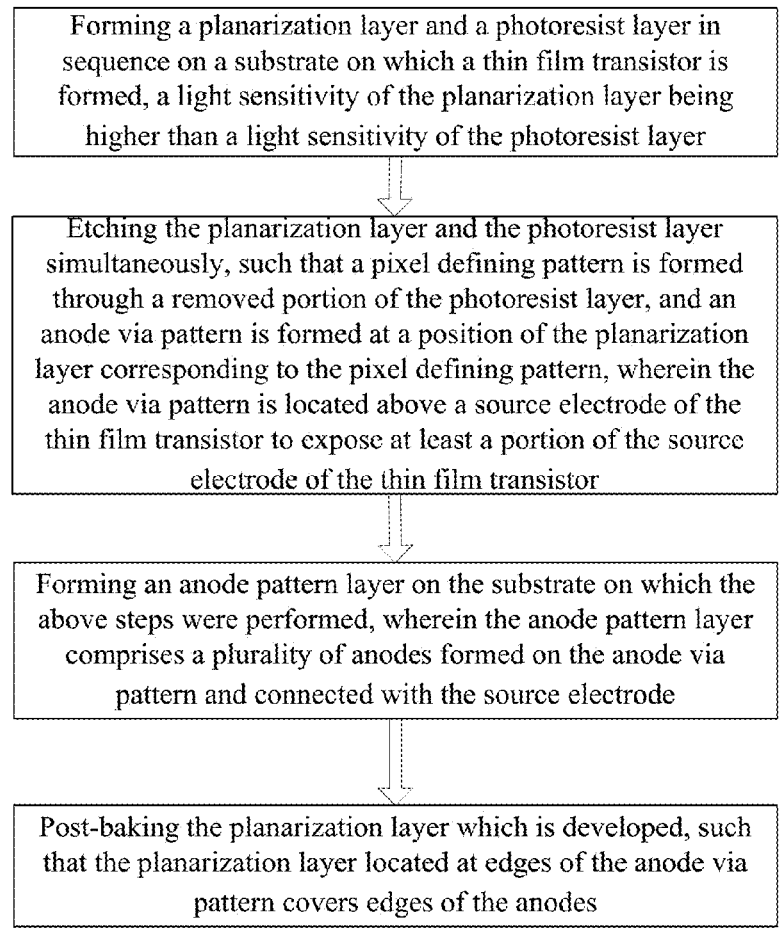
FIG. 1 is a flowchart of a manufacturing method provided by an embodiment of the present disclosure.

In an embodiment of the present disclosure, there is provided a method for manufacturing a light emitting diode display substrate. As shown in FIG. 1, the method includes the following steps:

forming a planarization layer and a photoresist layer in sequence on a substrate on which a thin film transistor is formed, wherein a light sensitivity of the planarization layer is higher than a light sensitivity of the photoresist layer;

etching the planarization layer and the photoresist layer simultaneously, such that a pixel defining pattern is formed through a removed portion of the photoresist layer, and an anode via pattern is formed at a position of the planarization layer corresponding to the pixel defining pattern, wherein the anode via pattern is located above a source electrode of the thin film transistor to expose at least a portion of the source electrode of the thin film transistor, and the etching may include a gray-scale exposure and a development;

forming an anode pattern layer on the substrate on which the above steps were performed, wherein the anode pattern layer includes a plurality of anodes formed on the anode via pattern and connected with the source electrode;

removing the residual portion of the photoresist layer and the anode pattern layer located on the photoresist layer using a stripping solution, such that the anode covering the planarization layer and thin film transistor (i.e., the anode formed on the anode via pattern) remains to be used as the anode of the OLED; and post-baking the planarization layer which is developed, such that the planarization layer located at an edge of the anode via pattern covers an edge of the anode.

The pixel defining pattern may be formed by forming an opening through the photoresist layer in the photoresist layer, and the anode via pattern may be formed by partially removing the planarization layer in an area corresponding to the pixel defining pattern.

In an embodiment according to the inventive concept, a gray-scale exposure is simultaneously performed on the planarization layer and the photoresist layer. The light sensitivity of the planarization layer is greater than the light sensitivity of the photoresist layer. The pixel defining pattern is formed through the removed portion of the photoresist layer. The anode via pattern is formed in the planarization layer, such that at least a portion of the source electrode of the thin film transistor is exposed in a fully exposed region of the photoresist layer and the planarization layer. A portion of the planarization layer remains in a semi-exposed region of the photoresist layer and the planarization layer. That is, in a region of the pixel defining pattern which is projected on the planarization layer, a portion of the planarization layer is completely removed in a thickness direction to expose at least a portion of the source electrode of the thin film transistor. The anode via pattern is formed by partially removing the remaining portion of the planarization layer which is located in the projected region in the thickness direction. A material for the anodes is deposited to form the anode pattern layer, which is separated at edges of the anode via pattern, such that the anode formed on the anode via pattern and the anode pattern layer located on the photoresist layer are included. Then, the planarization layer is post-baked, such that a material for the planarization layer at edges of the anode via pattern covers the edges of the anode (which here mainly refers to cover the edge of the burr), in order to avoid the occurrence of short circuit in the edge of the anode and other undesirable phenomena. Compared with the prior art, in the present disclosure, there is no need to specifically form the pixel defining layer, and the processes for patterning can be reduced while ensuring the product yield, thereby saving the production cost.

Optionally, a material for forming the planarization layer includes a diazonaphthoquinone-based photosensitive material or an epoxy resin-based photosensitive material, and a material for forming the photoresist layer includes a polyimide. Generally, the diazonaphthoquinone-based photosensitive material and the epoxy resin-based photosensitive material are positive photosensitive materials having high light sensitivity, which is higher than that of the polyimide material. In an embodiment of the present disclosure, the planarization layer and the photoresist layer are exposed simultaneously by using a halftone mask plate to obtain the anode via pattern.

For example, the thermal resistance properties of the diazonaphthoquinone-based photosensitive material are inferior to those of the polyimide material. The pore size of the membrane of the polyimide material does not change significantly after post-baking, while the diazonaphthoquinone-based photosensitive material will obviously reflow, such that the pore size of the membrane of the diazonaphthoquinone-based photosensitive material after post-baking becomes significantly smaller. Therefore, the planarization layer can cover the edge of the anode after post-baking.

Figure 2A:
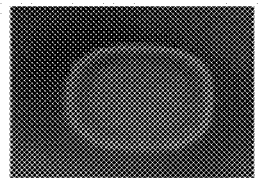
FIGS. 2a to 2b are schematic views of the pore size of the membrane of the iazonaphthoquinone-based photosensitive material after development and after post-baking.
Figure 2B:
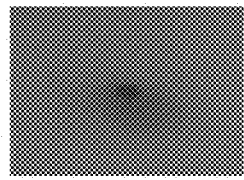
Figure 3A:
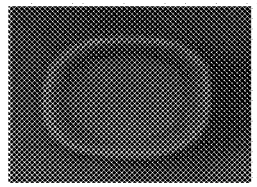
FIGS. 3a to 3b are schematic views of the pore size of the membrane of the polyimide material after development and after post-baking.
Figure 3B:
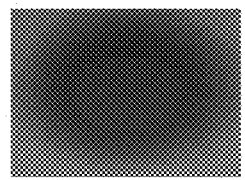

FIGS. 2a to 2b are schematic views of the pore size of the membrane of the iazonaphthoquinone-based photosensitive material after development and after post-baking. FIGS. 3a to 3b are schematic views of the pore size of the membrane of the polyimide material after development and after post-baking. It can be seen that the pore size of the membrane of the diazonaphthoquinone-based photosensitive material becomes significantly smaller after post-baking, and by using such characteristic of the diazonaphthoquinone-based photosensitive material, the planarization layer can cover the burr of the anode edge, thus ensuring the product yield without the need to form a pixel defining layer, thus the process steps can be reduced, thereby saving the production cost.

Although the planarization layer including the diazonaphthoquinone-based photosensitive material and the photoresist layer including the polyimide material are described in the embodiment of the present disclosure, the materials of the planarization layer and the photoresist layer are not limited thereto, as long as the light sensitivity of the planarization layer is greater than the light sensitivity of the photoresist layer, and the planarization layer can reflow and cover the burr of the anode edge after post-baking.

Optionally, the planarization layer has a thickness of 1.5 μm to 3 μm, and the photoresist layer has a thickness of 0.5 μm to 1 μm.

Optionally, the anode pattern layer has a thickness of 100 nm to 400 nm, and a material for forming the anode pattern layer may be metal, for example, may be any one of aluminum, molybdenum, and silver, or an alloy thereof. Alternatively, the material for forming the anode pattern layer may be indium tin oxide or indium zinc oxide.

Further, the substrate, on which the thin film transistor is formed, is formed by:

forming a gate pattern layer on a base substrate, the gate pattern layer including a gate electrode;

forming a gate insulating layer on the gate pattern layer;

forming an active layer on the gate insulating layer;

forming an etching barrier layer on the active layer;

forming a source/drain pattern layer on the etching barrier layer, the source/drain pattern layer including a source electrode and a drain electrode; and forming a passivation layer on the source/drain pattern layer.

Optionally, the base substrate has a thickness of 50 μm to 1000 μm, and a material for forming the base substrate can selected from Corning® glass, Asahi® glass or quartz glass.

Optionally, the gate pattern layer has a thickness of 200 nm to 1000 nm, and a metal for forming the gate pattern layer includes any one of aluminum, molybdenum, chromium, copper, and titanium, or an alloy thereof; and/or, the source/drain pattern layer has a thickness of 5 nm to 250 nm, and a metal for forming the source/drain pattern layer includes any one of aluminum, molybdenum, chromium, copper, and titanium, or an alloy thereof.

Optionally, the gate insulating layer has a thickness of 100 nm to 500 nm, and a material for forming the gate insulating layer includes silicon oxide or silicon nitride.

Optionally, the active layer has a thickness of 5 nm to 150 nm, and a material for forming the active layer includes any one of indium gallium zinc oxide, zinc oxynitride, and indium tin zinc oxide.

Optionally, the etching barrier layer has a thickness of 50 nm to 200 nm, and a material for forming the etching barrier layer includes silicon oxide or silicon nitride.

Optionally, the passivation layer has a thickness of 100 nm to 500 nm, and a material for forming the passivation layer includes silicon oxide or silicon nitride.

Further, after post-baking the planarization layer which is developed, the method further includes:

sequentially forming a hole injection layer, a hole transport layer, a light emitting layer, an electron transport layer, an electron injection layer, and a cathode on the anode pattern layer;

forming an encapsulation layer on the cathode; and forming a color filter layer on the encapsulation layer.

Generally, the light emitting diode display substrate is mainly composed of a thin film transistor and a light emitting diode. The thin film transistor is used to control the output of the voltage and current, and the light emitting diode is used to produce white light. Further, the light emitting diode display substrate may further include a color filter layer, which is used to obtain red, green and blue colors of light, or used to obtain red, green, blue and white colors of light. In addition, in an implementation of the present disclosure, the light emitting diode display substrate may further include a control circuit connected to the thin film transistor, which may be implemented in a variety of ways, and is not limited in the present disclosure.

Optionally, the encapsulation layer has a thickness of 100 nm to 300 nm, and a material for forming the encapsulation layer includes any one or any some of silicon nitride, silicon carbonitride and silicon carbide in a form of a laminate.

The manufacturing method of the embodiment of the present disclosure will be described in detail with reference to FIGS. 4a-4m.

Figure 4A:
FIGS. 4a to 4m are schematic views of a manufacturing process in an embodiment of the present disclosure.

First, a gate metal layer is deposited on a base substrate 1 by a sputtering method. The gate metal layer is patterned by a photolithography process and a wet etching process to form a gate pattern layer after peeling off a photoresist. The gate pattern layer includes a gate electrode 2, as shown in FIG. 4a.

The base substrate 1 has a thickness of 50 μm to 1000 μm. A material for forming the base substrate 1 may be Corning® glass, Asahi® glass, quartz glass, or the like. The gate pattern layer has a thickness of 200 nm to 1000 nm. A metal for forming the gate pattern layer includes any one of aluminum (Al), molybdenum (Mo), chromium (Cr), copper (Cu), and titanium (Ti), or an alloy thereof.

Figure 4B:
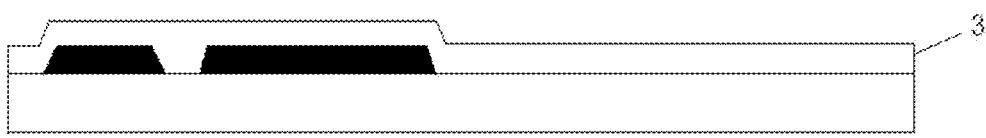

Thereafter, the gate insulating layer 3 is deposited by a chemical vapor deposition method, as shown in FIG. 4b. The gate insulating layer 3 may have a thickness of 100 nm to 500 nm. A material for forming the gate insulating layer 3 includes silicon oxide or silicon nitride, for example, a single layer or a multilayer film of $SiO_x$ and/or $SiN_x$.

Figure 4C:
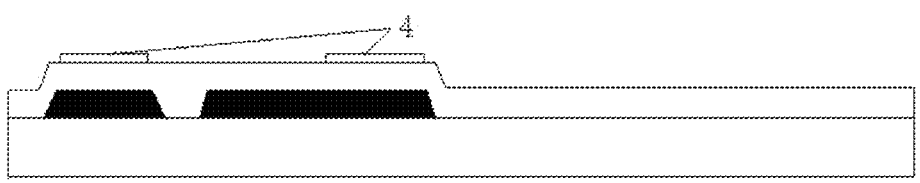

Thereafter, an active layer 4 is formed by depositing an amorphous oxide on the gate insulating layer 3 by a sputtering method. As shown in FIG. 4c, the active layer is patterned by a photolithography process and a wet etching process. The active layer pattern is formed after peeling off the photoresist. The active layer 4 may have a thickness of 5 nm to 150 nm. A material for forming the active layer 4 includes any one of indium gallium zinc oxide (IGZO), zinc oxynitride (ZnON), and indium tin zinc oxide (ITZO).

Figure 4D:
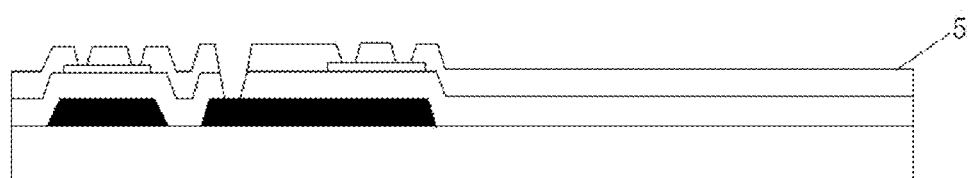

Thereafter, the etching barrier layer 5 is deposited by a chemical vapor deposition method. The etching barrier layer 5 is patterned by a photolithography process and a dry etching process, as shown in FIG. 4d. This step should avoid the residue of the inorganic film and over-etching of the active layer. The etching barrier layer 5 may have a thickness of 50 nm to 200 nm. A material for forming the etching barrier layer 5 includes silicon oxide or silicon nitride, such as $SiO_x$, $SiN_x$, or the like.

Figure 4E:
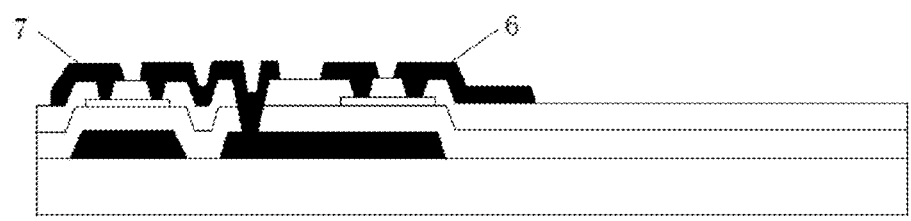

Thereafter, a source/drain metal layer is deposited on the etching barrier layer 5 by a sputtering method and is patterned by a photolithography process and a wet etching process to form a source/drain pattern layer, which includes a source electrode 6 and a drain electrode 7, as shown in FIG. 4e. The source/drain pattern layer may have a thickness of 5 nm to 250 nm. A material for forming the source/drain pattern layer includes any one of aluminum (Al), molybdenum (Mo), chromium (Cr), copper (Cu), and titanium (Ti), or an alloy thereof.

Figure 4F:
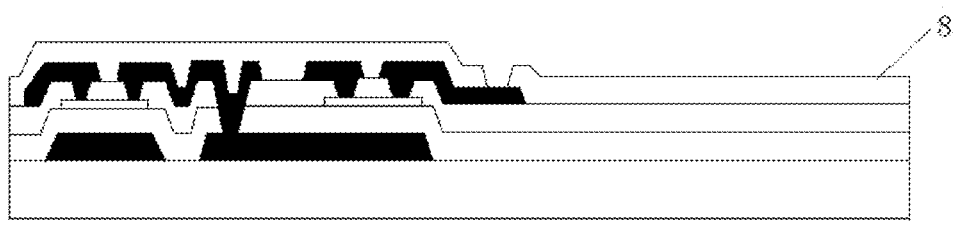

Thereafter, a passivation layer 8 is deposited by a chemical vapor deposition method and is patterned by a photolithography process and a dry etching process, such that at least a portion of the source electrode of the thin film transistor is exposed by the passivation layer, as shown in FIG. 4f. The passivation layer 8 may have a thickness of 100 nm to 500 nm. A material for forming the passivation layer 8 includes silicon oxide or silicon nitride, such as $SiO_x$, $SiN_x$, or the like.

Figure 4G:
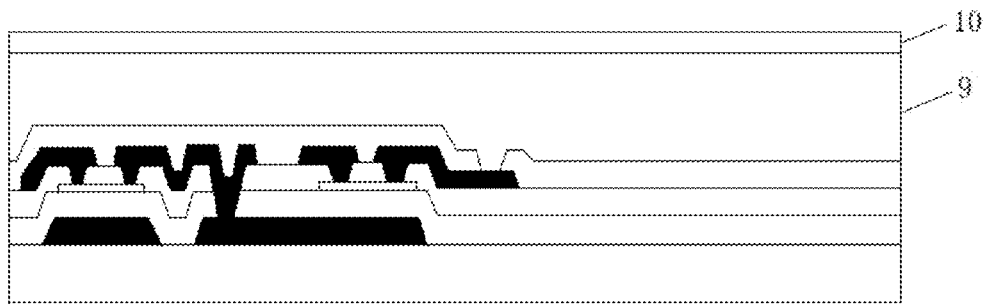
Figure 4H:
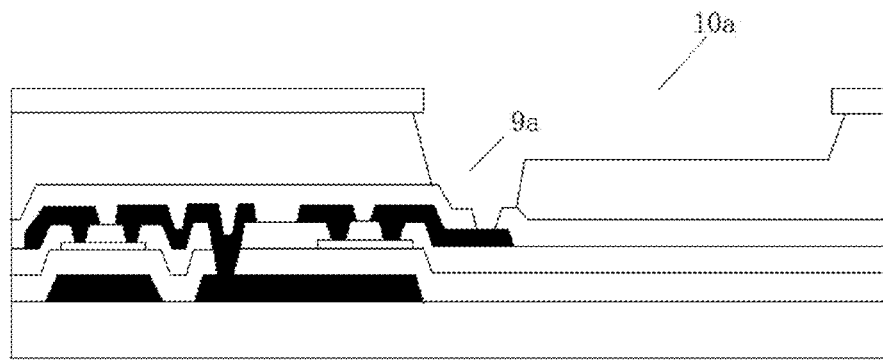

Thereafter, a planarization layer 9 and a photoresist layer 10 are sequentially spin-coated, as shown in FIG. 4g. Then, the planarization layer 9 and the photoresist layer 10 are subjected to a gray-scale exposure and a development by using a halftone masking plate. Portions of the photoresist layer 10 are removed to form a pixel defining pattern 10a. An anode via pattern 9a is formed at a position of the planarization layer 9 corresponding to the pixel defining pattern 10a, as shown in FIG. 4h. The anode via pattern 9a is located above the source electrode 6 of the thin film transistor to expose at least a portion of the source electrode of the thin film transistor. In particular, the pixel defining pattern 10a is formed by forming an opening through the photoresist layer 10 in the photoresist layer 10. An anode via pattern 9a is formed by partially removing the planarization layer 9 in the region corresponding to the pixel defining pattern 10a. Thus the anode via pattern 9a includes an opening through the planarization layer 9 formed in the planarization layer 9 and a portion of the planarization layer 9 that is partially removed in a thickness direction. The subsequently formed anode pattern layer will be formed on the anode via pattern 9a.

The planarization layer 9 may be formed by using a diazonaphthoquinone-based photosensitive material or an epoxy resin-based photosensitive material. The planarization layer 9 may have a thickness of 1.5 μm to 3 μm. The photoresist layer 10 may be formed by using a polyimide material. The photoresist layer 10 may have a thickness of 0.5 μm to 1 μm.

Figure 4I:
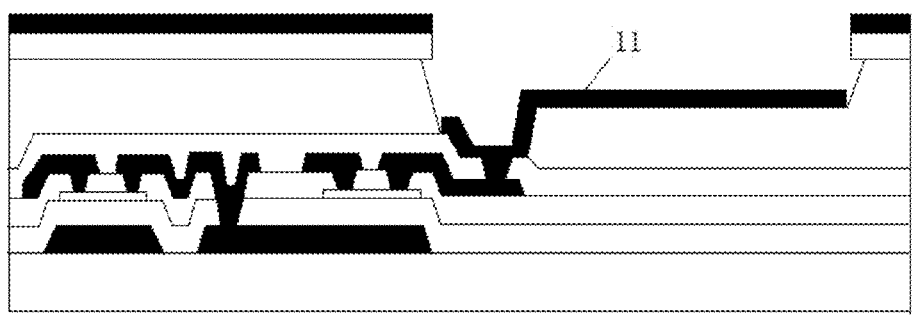

Thereafter, an anode material is deposited by a sputtering method to obtain an anode pattern layer including an anode 11 and a portion located on the photoresist layer 10. The anode 11 is formed on the anode via pattern 9a, as shown in FIG. 4i.

The anode pattern layer may have a thickness of 100 nm to 400 nm. A material for forming the anode pattern layer may be a metal, for example, may be any one of aluminum (Al), molybdenum (Mo), and silver (Ag), or an alloy thereof. Alternatively, the material for forming the anode pattern layer may be indium tin oxide (ITO) or indium zinc oxide (IZO).

Figure 4J:
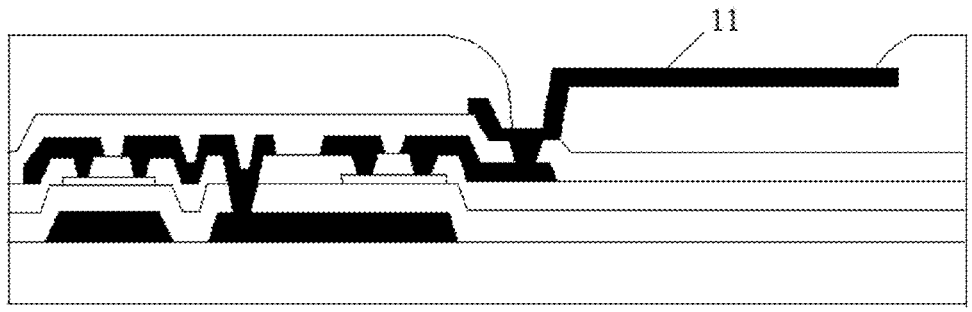

Thereafter, the residual photoresist and the anode pattern layer on the photoresist layer 10 are removed. The developed planarization layer 9 is post-baked, such that the planarization layer 9 located at edges of the anode via pattern 9a has a reflow phenomenon to cover edges of the anode 11, as shown in FIG. 4j.

Figure 4K:
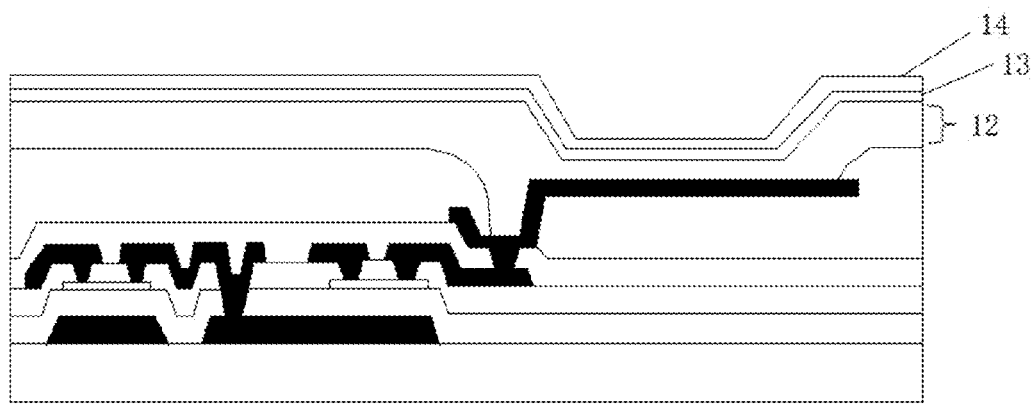

Thereafter, an organic light emitting diode interlayer 12 is formed on the anode pattern layer. The organic light emitting diode interlayer 12 includes a hole injection layer, a hole transport layer, a light emitting layer, an electron transport layer, and an electron injection layer located above the anode 11 in this order. Then a cathode 13 and an encapsulation layer 14 are formed on the organic light emitting diode interlayer 12, as shown in FIG. 4k.

Figure 4L:
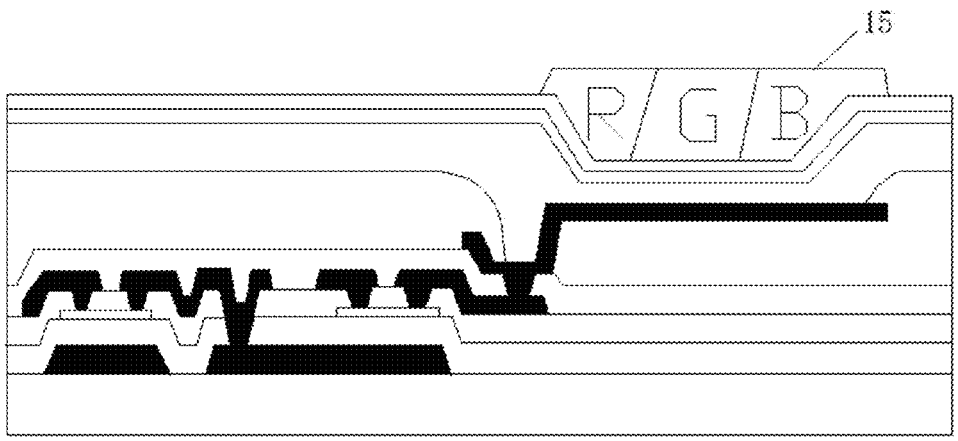

Thereafter, a color filter layer 15 is formed on the encapsulation layer 14, as shown in FIG. 4l. The color filter layer 15 is a low-temperature color film layer, including R, and B colors, arranged in a cross-shaped, a linear or other manners. The color filter layer 15 may have a thickness of 2.0 μm to 3.5 μm.

Figure 4M:
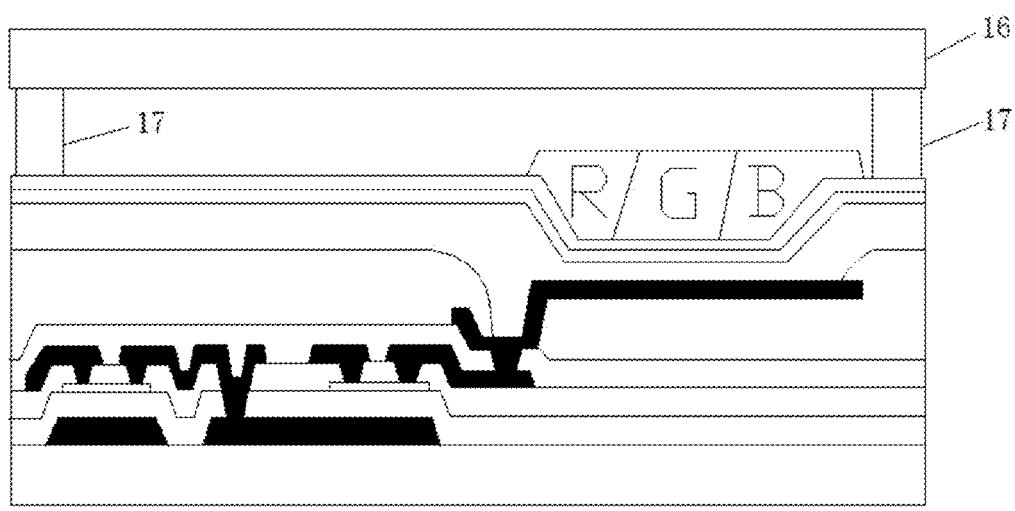

When a display device is required to be manufactured, the substrate, on which each of the above-described steps are performed. The encapsulation cover 16 are encapsulated by an adhesive 17, as shown in FIG. 4m.

The embodiment of the present disclosure also provides a light emitting diode display substrate, including a thin film transistor, a planarization layer and an anode pattern layer sequentially formed on a base substrate. The anode pattern layer includes a plurality of anodes, wherein an anode via pattern is formed in the planarization layer. The anode via pattern is located above a source electrode of the thin film transistor to expose at least a portion of the source electrode of the thin film transistor. The anodes are formed on the anode via pattern and connected with the source electrode, and the planarization layer located at edges of the anode via pattern covers edges of the anodes.

The light emitting diode display substrate manufactured by the method of the embodiment of the present disclosure can reduce the processes for patterning and save the production cost. Also, the light emitting diode display substrate in the embodiment of the present disclosure does not need to use a pixel defining layer. The planarization layer can serve to define a pixel. The material of the planarization layer can cover edges of the anode, avoiding the occurrence of short circuit and other undesirable display phenomena due to the burr of the anode edge, and ensuring the product yield.

The embodiment of the present disclosure also provides a display device, including the above-described light emitting diode display substrate provided by the embodiment of the present disclosure. In addition, the display device further includes an encapsulation cover which is fixedly connected with the light emitting diode display substrate by an adhesive.

As described above, the display device provided by the embodiment of the present disclosure has advantages of simple production process, low production cost, high product yield and so on.

It is to be understood that the above embodiments are merely exemplary embodiments employed for the purpose of illustrating the principles of the present disclosure, but the present disclosure is not limited thereto. It will be apparent to those skilled in the art that various changes and modifications can be made therein without departing from the spirit and principle of the present disclosure, which are also deemed to be within the scope of the present disclosure.

What is claimed is:

1. A method for manufacturing a light emitting diode display substrate, comprising:
   forming a planarization layer and a photoresist layer in sequence on a substrate on which a thin film transistor is formed, a light sensitivity of the planarization layer being higher than a light sensitivity of the photoresist layer;
   etching the planarization layer and the photoresist layer simultaneously, such that a pixel defining pattern is formed through a removed portion of the photoresist layer, and an anode via pattern is formed at a position of the planarization layer corresponding to the pixel defining pattern, wherein the anode via pattern is located above a source electrode of the thin film transistor to expose at least a portion of the source electrode of the thin film transistor;
   forming an anode pattern layer on the substrate on which the above steps were performed, wherein the anode pattern layer comprises a plurality of anodes formed on the anode via pattern and connected with the source electrode; and
   post-baking the planarization layer which is developed, such that the planarization layer located at edges of the anode via pattern covers edges of the anodes.

2. The method of claim 1, wherein a material for forming the planarization layer includes a diazonaphthoquinone-based photosensitive material or an epoxy resin-based photosensitive material, and a material for forming the photoresist layer includes a polyimide.

3. The method of claim 1, wherein a material for forming the anode pattern layer includes any one of aluminum, molybdenum, and silver, or an alloy thereof, or the material for forming the anode pattern layer includes indium tin oxide or indium zinc oxide.

4. The method of claim 1, wherein the substrate, on which the thin film transistor is formed, is formed by:
    forming a gate pattern layer on a base substrate, the gate pattern layer comprising a gate electrode;
    forming a gate insulating layer on the gate pattern layer;
    forming an active layer on the gate insulating layer;
    forming an etching barrier layer on the active layer;
    forming a source/drain pattern layer on the etching barrier layer, the source/drain pattern layer comprising a source electrode and a drain electrode; and
    forming a passivation layer on the source/drain pattern layer.

5. The method of claim 4, wherein a metal for forming the gate pattern layer and/or the source/drain pattern layer includes any one of aluminum, molybdenum, chromium, copper, and titanium, or an alloy thereof.

6. The method of claim 4, wherein a material for forming the gate insulating layer includes silicon oxide or silicon nitride.

7. The method of claim 4, wherein a material for forming the active layer includes any one of indium gallium zinc oxide, zinc oxynitride, and indium tin zinc oxide.

8. The method of claim 4, wherein a material for forming the etching barrier layer includes silicon oxide or silicon nitride.

9. The method of claim 4, wherein a material for forming the passivation layer includes silicon oxide or silicon nitride.

10. The method of claim 1, wherein after post-baking the planarization layer which is developed, the method further comprises:
    sequentially farming a hole injection layer, a hole transport layer, a light emitting layer, an electron transport layer, an electron injection layer, and a cathode on the anode pattern layer;
    forming an encapsulation layer on the cathode; and
    forming a color filter layer on the encapsulation layer.

11. The method of claim 10, wherein a material for forming the encapsulation layer includes any one or any some of silicon nitride, silicon carbonitride and silicon carbide in a form of a laminate.

12. The method of claim 1, wherein the pixel defining pattern is formed by forming an opening through the photoresist layer in the photoresist layer, and the anode via pattern is formed by partially removing the planarization layer in an area corresponding to the pixel defining pattern.

13. The method of claim 1, further comprising:
    removing a remainder of the photoresist layer and the anode pattern layer located on the photoresist layer, after forming the anode pattern layer and before post-baking the planarization layer which is developed.

14. The method of claim 1, wherein the planarization layer has a thickness of 1.5 µm to 3 µm, and the photoresist layer has a thickness of 0.5 µm to 1 µm.

15. The method of claim 1, wherein the anode pattern layer has a thickness of 100 nm to 400 nm.

16. The method of claim 1, wherein the etching of the planarization layer and the photoresist layer simultaneously is performed by using a halftone mask plate.

* * * * *